(12) United States Patent
Xie et al.

(10) Patent No.: US 9,680,062 B2
(45) Date of Patent: *Jun. 13, 2017

(54) OPTOELECTRONIC DEVICES INCORPORATING SINGLE CRYSTALLINE ALUMINUM NITRIDE SUBSTRATE

(71) Applicant: HexaTech, Inc., Morrisville, NC (US)

(72) Inventors: Jinqiao Xie, Allen, TX (US); Baxter Moody, Raleigh, NC (US); Seiji Mita, Cary, NC (US)

(73) Assignee: HexaTech, Inc., Morrisville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/054,889

(22) Filed: Feb. 26, 2016

(65) Prior Publication Data

US 2016/0181474 A1    Jun. 23, 2016

Related U.S. Application Data

(63) Continuation of application No. 14/165,943, filed on Jan. 28, 2014, now Pat. No. 9,299,883.

(Continued)

(51) Int. Cl.
*H01L 33/32* (2010.01)
*H01L 33/02* (2010.01)
(Continued)

(52) U.S. Cl.
CPC .......... *H01L 33/32* (2013.01); *H01L 21/0251* (2013.01); *H01L 21/0254* (2013.01);
(Continued)

(58) Field of Classification Search
CPC combination set(s) only.
See application file for complete search history.

(56) References Cited

U.S. PATENT DOCUMENTS 5,523,589 A    6/1996    Edmond et al.
5,592,501 A    1/1997    Edmond et al.
(Continued)

FOREIGN PATENT DOCUMENTS

JP    2006 278 570    10/2006
JP    2006 290 662    10/2006
(Continued)

OTHER PUBLICATIONS

Collazo et al. (2011) "Progress on n-type doping of AlGaN alloys on AlN single crystal substrates for UV optoelectronic applications," *Physica Status Solidi C—Current Topics in Solid State Physics*, vol. 8, pp. 7-8.

(Continued)

*Primary Examiner* — Kyoung Lee
*Assistant Examiner* — Ratisha Mehta
(74) *Attorney, Agent, or Firm* — Womble Carlyle Sandridge & Rice LLP (57) ABSTRACT

The invention provides an optoelectronic device adapted to emit ultraviolet light, including an aluminum nitride single crystalline substrate, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec; and an ultraviolet light-emitting diode structure overlying the aluminum nitride single crystalline substrate, the diode structure including a first electrode electrically connected to an n-type semiconductor layer and a second electrode electrically connected to a p-type semiconductor layer. In certain embodiments, the optoelectronic devices of the invention exhibit a reverse leakage current less than about $10^{-5}$ A/cm$^2$ at −10 V and/or an L80 of at least about 5000 hours at an injection current density of 28 A/cm$^2$.

21 Claims, 8 Drawing Sheets

Related U.S. Application Data (60) Provisional application No. 61/758,053, filed on Jan. 29, 2013.

(51) Int. Cl.
　　　H01L 21/02　　　(2006.01)
　　　H01L 33/06　　　(2010.01)
　　　H01L 33/16　　　(2010.01)
　　　H01L 33/50　　　(2010.01)
　　　H01L 33/00　　　(2010.01)

(52) U.S. Cl.
　　　CPC .. H01L 21/02389 (2013.01); H01L 21/02458 (2013.01); H01L 33/025 (2013.01); H01L 33/06 (2013.01); H01L 33/16 (2013.01); H01L 33/504 (2013.01); *H01L 33/0075* (2013.01)

(56) References Cited

U.S. PATENT DOCUMENTS

| | | | |
|---|---|---|---|
| 6,045,612 | A | 4/2000 | Hunter |
| 6,066,205 | A | 5/2000 | Hunter |
| 6,110,424 | A | 8/2000 | Maiden et al. |
| 6,296,956 | B1 | 10/2001 | Hunter |
| 6,579,495 | B1 | 6/2003 | Maiden |
| 6,690,035 | B1 | 2/2004 | Yokogawa et al. |
| 6,888,170 | B2 | 5/2005 | Schaff et al. |
| 6,953,740 | B2 | 10/2005 | Schaff et al. |
| 7,501,023 | B2 | 3/2009 | Dmitriev et al. |
| 7,632,454 | B2 | 12/2009 | Schlesser et al. |
| 7,678,195 | B2 | 3/2010 | Schlesser et al. |
| 7,678,198 | B2 | 3/2010 | Hartig |
| 7,815,970 | B2 | 10/2010 | Schlesser et al. |
| 7,915,178 | B2 | 3/2011 | Collazo et al. |
| 8,080,833 | B2 | 12/2011 | Grandusky et al. |
| 8,123,859 | B2 | 2/2012 | Schowalter et al. |
| 8,222,650 | B2 | 7/2012 | Schowalter et al. |
| 8,455,909 | B2 | 6/2013 | Negley |
| 8,545,629 | B2 | 10/2013 | Schowalter et al. |
| 2002/0028291 | A1 | 3/2002 | Shibata et al. |
| 2005/0000913 | A1 | 1/2005 | Betterly |
| 2006/0138443 | A1 | 6/2006 | Fan et al. |
| 2006/0163126 | A1 | 7/2006 | Maiden |
| 2006/0216193 | A1 | 9/2006 | Johnson et al. |
| 2007/0029558 | A1* | 2/2007 | Nishizono ............ H01L 21/326 257/96 |
| 2007/0086912 | A1 | 4/2007 | Dowling et al. |
| 2007/0096239 | A1 | 5/2007 | Cao et al. |
| 2007/0101932 | A1* | 5/2007 | Schowalter ........... C30B 11/003 117/84 |
| 2007/0131160 | A1 | 6/2007 | Slack et al. |
| 2007/0131872 | A1 | 6/2007 | Shearer et al. |
| 2007/0134827 | A1 | 6/2007 | Bondokov et al. |
| 2007/0159067 | A1 | 7/2007 | Yun et al. |
| 2007/0206164 | A1 | 9/2007 | Beeson et al. |
| 2007/0243653 | A1 | 10/2007 | Morgan et al. |
| 2007/0257333 | A1* | 11/2007 | Schlesser ............ C30B 29/403 257/613 |
| 2008/0003649 | A1 | 1/2008 | Maltezos et al. |
| 2008/0083970 | A1 | 4/2008 | Kamber et al. |
| 2008/0087914 | A1 | 4/2008 | Li et al. |
| 2008/0132040 | A1 | 6/2008 | Wang et al. |
| 2008/0182092 | A1 | 7/2008 | Bondokov et al. |
| 2008/0187016 | A1 | 8/2008 | Schowalter et al. |
| 2008/0199353 | A1 | 8/2008 | Mlodzinski et al. |
| 2009/0084734 | A1 | 4/2009 | Yencho |
| 2009/0250626 | A1 | 10/2009 | Schlesser et al. |
| 2010/0032682 | A1 | 2/2010 | Zimmerman et al. |
| 2010/0207166 | A1 | 8/2010 | Zhu |
| 2010/0237254 | A1 | 9/2010 | Mason et al. |
| 2010/0242835 | A1 | 9/2010 | Arena et al. |
| 2010/0264460 | A1 | 10/2010 | Grandusky et al. |
| 2010/0301490 | A1 | 12/2010 | Simin et al. |
| 2010/0314551 | A1 | 12/2010 | Bettles et al. |
| 2011/0133262 | A1 | 6/2011 | Wahl et al. |
| 2011/0198643 | A1 | 8/2011 | Kim |
| 2012/0000414 | A1 | 1/2012 | Bondokov et al. |
| 2012/0240845 | A1* | 9/2012 | Fukuyama .............. C30B 25/00 117/102 |
| 2013/0168689 | A1 | 7/2013 | Lee |
| 2014/0239305 | A1 | 8/2014 | Shah et al. |

FOREIGN PATENT DOCUMENTS

| | | |
|---|---|---|
| JP | 2010 042 950 | 2/2010 |
| WO | WO 2008/042020 | 4/2008 |
| WO | WO 2009/090821 | 7/2009 |
| WO | WO 2009/090923 | 7/2009 |
| WO | WO 2010/001803 | 1/2010 |
| WO | WO2010-122933 | 10/2010 |

OTHER PUBLICATIONS

Collazo et al. "265 nm light emitting diodes on AlN single crystal substrates: Growth and characterization," (2011 Conference on Lasers and Electro-Optics (CLEO)), 2011.
Dalmau et al. "Characterization of dislocation arrays in AlN single crystals grown by PVT," *Phys. status solidi A* 2011, 208 (7), 1545-7.
Dalmau et al. "Growth and characterization of AlN and AlGaN epitaxial films on AlN single crystal substrates," *Journal of the Electrochemical Society*, 2011, 158(5), H530-H535.
Ehrentraut, et al. "Advances in bulk crystal growth of AlN and GaN," *MRS Bulletin*, 2009, vol. 34, (4), 259-265.
Herro et al. "Growth of AlN single crystalline boules," *Journal of Crystal Growth*, 2010, 312 (18) pp. 2519-2521.
Grandusky et al. "Performance and reliability of ultraviolet-C pseudomorphic light emitting diodes on bulk AlN substrates," *Phys. Status Solidi C*, 2010, vol. 7, pp. 2199-2201.
Lu et al., "Seeded growth of AlN bulk crystals in m- and c-orientation," *Journal of Crystal Growth*, 2009, 312(1), 58-63.
Raghothamachar et al. "Low defect density bulk AlN substrates for high performance electronics and optoelectronics," *Materials Science Forum*, 2012, vols. 717-720, pp. 1287-1290.
Bettles et al., "UV Light Emitting Diodes Their Applications and Benefits," *IUVA News*, vol. 9, No. 2, Jun. 2007, pp. 11-15.
Schowalter et al., "Preparation and Characterization of Single-Crystal Aluminum Nitride Substrates," *Mat. Res. Soc. Symp.*, 2000, vol. 595, pp. W6.7.1-W6.7.6.
Tweedie et al., "Schottky Barrier and Interface Chemistry for Ni Contacted to $Al_{0.8}Ga_{0.2}N$ Grown on C-Oriented AlN Single Crystal Substrates," *Phys. Status Solidi C9*, 2012, vol. 9, No. 3-4, pp. 584-587.
Xie et al., "Ni/Au Schottky Diodes on $Al_xGa_{1-x}$ N (0.7<x<1) Grown on AlN Single Crystal Substrates," *Phys. Status Solidi C8*, 2011, vol. 8, No. 7-8, pp. 2407-2409.
Collazo et al., "On the origin of the 265 nm absorption band in AlN bulk crystals," *Applied Physics Letters*, 2012, pp. 191914-1 to 191914-5, vol. 100.
Crystals Is "Optan (data sheet)," www.cisuve.com, 2014, 8 pages.
Figge et al., "Temperature Dependence of the Thermal Expansion of AlN," *Applied Physics Letters*, 2009, pp. 101915-1 to 101915-3, vol. 94.
Kitamura et al., "Reliability and Lifetime of Pseudomorphic UVC LEDs on AlN Substrate Under Various Stress Condition," *IEEE Lester Eastman Conference on High Performance Devices (LEC)*, 2014, 5 pages.
Mueller, et al., "The Progress of AlN Bulk Growth and Epitaxy for Electronic Applications," *Phys. Status Solidi A*, 2009, pp. 1-7.
Nagashima et al., "Structural and Optical Properties of Carbon-Doped AlN Substrates Grown by Hydride Vapor Phase Epitaxy Using AlN Substrates Prepared by Physical Vapor Transport," *Applied Physics Express*, 2012, vol. 5, pp. 125501-1 to 125501-3.
OSRAM Opto Semiconductors, "Reliability and Lifetime of LEDs," (brochure) 2013, pp. 1-14.
Raghothamachar et al., "X-ray Characterization of Bulk AlN Single Crystals Grown by the Sublimation Technique," *Journal of Crystal Growth*, 2003, pp. 244-250, vol. 250.

(56) References Cited

OTHER PUBLICATIONS

Rojo et al., "Report on the Growth of Bulk Aluminum Nitride and Subsequent Preparation," *Journal of Crystal Growth*, 2001, pp. 317-321, vol. 231.
Schlesser et al., "Seeded Growth of AlN Bulk Single Crystals by Sublimation," *Journal of Crystal Growth*, 2002, pp. 416-420, vol. 241.
Sensor Electronic Technology, Inc., "Sensor Electronic Technology, Inc. achieves more than 10,000 houra lifetime on UVTOP® ultraviolet LEDS," (press release) 2011, 1 page.
US Department of Energy, Energy Efficiency and Renewable Energy, "Lifetime of White LEDS," Building Technologies Program (brochure), 2009, 2 pages.
Weiwei et al., "Wet Etching and Infrared Absorption of AlN Bulk Single Crystals," *Journal of Semiconductors*, 2009, pp. 073002-1 to 073002-4, vol. 30, No. 7.
Wunderer, et al., "Optically pumped UV lasers grown on bulk AlN substrates," *Phys. Status Solidi C*, 2012, pp. 1-4, vol. 9, Nos. 3-4.
Alevli et al., "The Influence of N2/H2 and Ammonia N Source Materials on Optical and Structural Properties of AlN Films Grown by Plasma Enhanced Atomic Layer Deposition," *Journal of Crystal Growth*, 2011, pp. 51-57, vol. 335.
Kumagai et al., "Prepation of a Freestanding AlN Substrate from a Thick AlN Layer Grown by Hydride Vapor Phase Epitaxy on a Bulk AIS Substrate Prepared by Physical Vapor Transport," *Applied Physics Express*, 2012, pp. 05504-1-05504-3.

\* cited by examiner

OPTOELECTRONIC DEVICES INCORPORATING SINGLE CRYSTALLINE ALUMINUM NITRIDE SUBSTRATE

CROSS-REFERENCE TO RELATED APPLICATIONS

This application is a continuation of U.S. application Ser. No. 14/165,943, filed Jan. 28, 2014, which claims priority to U.S. Provisional Patent Application No. 61/758,053, filed Jan. 29, 2013, the disclosure of which is incorporated herein by reference in its entirety.

FIELD OF THE INVENTION

The present invention relates to optoelectronic devices incorporating an aluminum nitride single crystalline substrate layer.

BACKGROUND OF THE INVENTION

Optoelectronic devices, for example semiconductor light sources, are devices in which an optical input produces an electrical output, or in which electrical stimulation produces visible, infrared or ultraviolet output. To form a semiconductor light source, such as light-emitting diodes ("LEDs") and laser diodes ("LDs"), for example, a multilayer structure is fabricated which comprises a substrate base as well as an active region including an n-type semiconductor layer electrically connected to a p-type semiconductor layer. The active region often comprises one or more quantum wells sandwiched between thicker cladding layers.

One useful type of semiconductor light source operates in the ultraviolet ("UV") range. The wavelength of the light emitted depends on the band gap energy of the materials forming the p-n junction. III-nitride based devices are capable of achieving shorter wavelengths in the ultraviolet range. There exists a need for stable and long-lasting optoelectronic devices operating in the UV range, and more particularly, in the deep-UV range. The ability to provide UV-emitting devices featuring stable light output and long lifetimes would simplify system design and lower costs. However, commercially available devices operating in the UV range, particularly in the deep-UV range, have not reached the level of efficiency and technological maturity of the visible light-emitting devices.

Sapphire substrates are typically used to fabricate III-nitride based light-emitting devices. It is possible to obtain relatively low-cost III-nitride semiconductor devices by using highly transparent sapphire as a substrate; however, with poor reliability (very low lifetime). The reason is due to the incompatibility between the lattice constant of the sapphire substrate and the fabricated device layers, a large density of dislocations of approximately $10^9$-$10^{10}$ cm$^{-2}$ is typically in the device structure. At the interface between the substrate and the device structure, the dislocation density will even be orders higher. The defect density in III-nitride based devices mainly refers to dislocation density and associated point defects. In the case of GaAs based LED and LD devices, for example, dislocations are the primary failure reason.

This elevated defect density negatively impacts the light emission efficiency and the lifetime of the device. Commercially available UVB (wavelength range of approximately 315-280 nm) and UVC (wavelength range of approximately 280-100 nm) optoelectronic devices (deep-UV or "DUV" LEDs) have short lifetimes, frequently as low as only tens to hundreds of hours, due to this high defect density resulting from the incompatibility of the substrate and the fabricated device layers.

There are some experimental reports of UV-emitting LEDs formed using aluminum nitride (AlN) substrates. However, the heretofore published performance information for such LED structures indicates a drop in output power to 80% in about 300 hours (i.e., an L80 of about 300 hrs) at an injection current of 150 mA. See Grandusky et al. (2010) Performance and reliability of ultraviolet-C pseudomorphic light emitting diodes on bulk AlN substrates, Phys. Status Solidi C, 7: 2199-2201, the entire disclosure of which is hereby incorporated by reference. If the L80 lifetime for an LED is very low, systems must be designed with excessive output power at the beginning of life so that the device remains within the minimum specifications at the end of its usable life.

In sum, considerable efforts have been devoted to producing UV LEDs on sapphire substrates, but the natures of the heteroepitaxy sets a high defect density that cannot be further reduced. Although it has been suggested that UV LEDs can be prepared from AlN substrates, such LED structures having high performance characteristics have not been demonstrated. Accordingly, there remains a need in the art for high performance, low defect density optoelectronic devices that emit light in the UV range.

SUMMARY OF THE INVENTION

Embodiments of the present invention disclose optoelectronic devices that operate in the UV spectral range and have long lifetimes. III-nitride semiconductors enable short wavelength light emission in the UV spectral range and can be used for the fabrication of white light LEDs, UV-LEDs, lasers for high density optical disc storage applications, and light emitting sources for laser communications. DUV devices fabricated on single crystalline aluminum nitride AlN have a defect density and reverse leakage current several orders of magnitude lower than similar devices fabricated on sapphire substrates due to a smaller difference between the lattice constants of the substrate and the device layers. A key issue limiting the performance of UV light emitting devices is a high dislocation density in the device active region which reduces the electrical efficiency, the internal quantum efficiency ("IQE"), and the lifetime of the devices. To reduce the dislocation density in the active layers according to the present invention, UV light-emitting devices are fabricated on high quality, single crystalline AlN substrates with low dislocation density prepared by physical vapor transport (PVT). The dislocation density of the single crystalline AlN substrates described herein is typically lower than about $10^5$ cm$^{-2}$, preferably lower than about $10^4$ cm$^{-2}$, more preferably lower than about $10^3$ cm$^2$, and most preferably lower than about $10^2$ cm$^{-2}$. Additionally, AlN substrates used in the present invention are characterized by (002) and (102) double axis rocking curves with Full Width Half Maximum ("FWHM") of less than about 100 arcsec, more preferably less than about 50 arcsec, and most preferably less than about 25 arcsec.

In certain embodiments, the light-emitting devices prepared using the high quality AlN substrates of the invention have a reverse leakage current lower than $10^{-5}$ A at −10V. Furthermore, in some embodiments, devices fabricated on the high quality substrates described herein exhibit surprisingly high L80 output power of at least about 2000 hours at an injection current density of 28 A/cm$^2$, or at least about 5000 hours at an injection current density of 28 A/cm$^2$.

Specifically, embodiments of the present invention disclose an optoelectronic device adapted to emit ultraviolet light comprising an aluminum nitride single crystalline substrate with a dislocation density less than about $10^5$ cm$^{-2}$ and a FWHM of the double axis rocking curve for the (002) and (102) crystallographic planes of less than about 200 arcsec. The device further comprises an ultraviolet light-emitting diode structure overlying the aluminum nitride substrate. This light-emitting structure (e.g., LED) structure can be deposited onto the substrate by metal organic chemical vapor deposition method or by other methods known in the art. This LED includes a first electrode electrically connected to an n-type semiconductor layer and a second electrode electrically connected to a p-type semiconductor layer. In a preferred embodiment, the n-type semiconductor layer includes n-$Al_{0.75}Ga_{0.25}N$. In a preferred embodiment, the p-type semiconductor layer includes p-GaN.

The UV light-emitting diode structure described herein can further include a multi-well active region extending between the n-type semiconductor layer and the p-type semiconductor layer. Depending on the materials used in this active region and the thickness of the layers, the optoelectronic device can have an emission wavelength, in certain preferred embodiments, of from about 150 nm to about 300 nm. In some embodiments, the device can have an emission wavelength of from about 250 nm to about 290 nm. In a preferred embodiment, the multi-well active region comprises at least one well layer adjacent to at least one barrier layer. In a preferred embodiment, the at least one well layer comprises $Al_{0.6}Ga_{0.4}N$.

The UV light-emitting diode structure described herein can also include a homoepitaxial layer (i.e., an aluminum nitride layer) fabricated above the substrate. The UV LED can also include a buffer layer fabricated above the substrate. In an embodiment, the buffer layer can have a composition approximately equal to that of the substrate. In alternative embodiments, the buffer layer can consist essentially of the same semiconductor materials used for the multi-well active region of the LED device. The UV LED can further include a blocking layer fabricated above the multi-well active region. In a preferred embodiment, the blocking layer is an electron blocking layer comprising $Al_xGa_{x-1}N$ and at least one impurity.

BRIEF DESCRIPTION OF THE DRAWINGS

Having thus described the disclosure in the foregoing general terms, reference will now be made to the accompanying drawings, which are not necessarily drawn to scale, and wherein:

DETAILED DESCRIPTION OF THE INVENTION

The present disclosure will now be described more fully hereinafter with reference to exemplary embodiments thereof. These exemplary embodiments are described so that this disclosure will be thorough and complete, and will fully convey the scope of the disclosure to those skilled in the art. Indeed, the present disclosure may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

Embodiments of the present invention relate to optoelectronic devices, such as LEDs and LDs, capable of operation in the UV spectral range and having high performance characteristics. An optoelectronic device fabricated on a substrate will maintain the crystal structure, including deficiencies, of the substrate underlying the device. A key issue limiting the performance of commercially available UV LEDs and UV LDs is a high dislocation density in the device active region due to 1) lattice mismatch between the substrate and active layers or 2) a high dislocation density in the substrate used as the base for fabricating the optoelectronic device. In accordance with the present invention, to reduce the dislocation density in the active layers, UV LEDs and UV LDs are fabricated on single crystalline AlN substrates with low dislocation density prepared by physical vapor transport (PVT). Exemplary crystalline AlN substrates used in the present invention exhibit a dislocation density on the order of $10^2$ to $10^3$ cm$^{-2}$, which allows the device structure grown thereon to have ultra-low dislocation density and associated point defects. This in turn leads to optoelectronic devices with surprisingly high performance characteristics, including long lifetimes and increased efficiency.

AlN Substrate

III-nitride semiconductor materials with a low defect density can be used to fabricate high performance optoelectronic devices. Minimizing the difference between the lattice constants of the substrate and the device layers results in a lower dislocation density throughout the device. Therefore, it is desirable to use AlN or GaN single crystals as substrates for III-nitride based devices, since the use of these native III-nitride substrates minimizes the difference in lattice constant between the substrate and the device layers. Also, AlN and GaN substrates possess high thermal conductivity and can therefore help dissipate the Joule heat generated by the process of current injection in the light-emitting layers. Heat dissipation during fabrication of the device layers is understood to enhance the device lifetime.

Despite the increased performance characteristics of optoelectronic devices fabricated from III-nitride substrates, high performance optoelectronic devices cannot be fabricated from low quality AlN or GaN substrates. The use of substrates with low dislocation density is preferable because dislocations present in the substrate tend to propagate into the device layers.

In the present invention, AlN single crystal substrates are particularly preferred, and such substrates can be c-plane, m-plane, a-plane, or r-plane. "Single crystal" refers to the crystal having ordered lattice atoms with one orientation in 3-D. An optoelectronic device built on a single crystal substrate will inherit the crystalline orientation of the substrate. By contrast, "polycrystalline" refers to the presence of many orientations with many grain boundaries, which are absent in the single crystal. As applied to the substrates of the invention, "single crystal substrate" refers to the presence, at a minimum, of at least one single crystal surface available for growth of an optoelectronic device, which would include substrates that have a homogenous single crystal structure throughout its thickness as well as substrates having a single crystal layer bonded to a polycrystalline substrate. Single crystalline AlN is an III-nitride semiconductor material that features a direct bandgap of approximately 6 eV. This represents a larger bandgap than other nitrides such as GaN and InN, and it is therefore possible to alloy AlN with Ga or In in order to engineer the bandgap energy.

Processes for preparing the single crystal AlN substrate can vary, but will typically involve physical vapor transport as opposed to chemical vapor deposition (CVD) techniques that involve chemical reaction of precursor molecules to form the desired material, meaning the preferred process involves physical transport of a vapor of the desired material (i.e., AlN) from an AlN source to a deposition location in a crucible or other crystal growth chamber. The deposition area typically includes a single crystal AlN seed material and the growth process is typically conducted in an inductively-heated reactor. Seeded PVT growth processes for growing single crystal AlN substrates suitable for use in the present invention are set forth, for example, in U.S. Pat. No. 7,678,195 to Schlesser et al; Ehrentraut, D., & Sitar, Z. (2009) Advances in bulk crystal growth of AlN and GaN, MRS Bulletin, 34(4), 259-265; Lu et al. (2009) Seeded growth of AlN bulk crystals in m- and c-orientation, Journal of Crystal Growth, 312(1), 58-63; and Herro et al. (2010) Growth of AlN single crystalline boules, Journal of Crystal Growth, 312 (18) 2519-2521, the entire disclosure of each being hereby incorporated by reference. Single crystal AlN substrates suitable for use in the present invention are commercially available from HexaTech, Inc. of Morrisville, N.C. Crucibles useful in PVT crystal growth processes are set forth in U.S. Pat. No. 7,632,454 to Schlesser et al., which is also incorporated by reference herein.

High-quality substrates result in improved light output and a reduction in device failure for the light-emitting devices fabricated on the substrates. Evaluation of the quality of a single crystal substrate can be based on several measurements, including dislocation density. Exemplary techniques for measuring defects in single crystal structures are known in the art, such as those techniques set forth, for example, in Dalmau et al. (2011) Characterization of dislocation arrays in AlN single crystals grown by PVT, Phys. status solidi A 208 (7), 1545-7 and Raghothamachar et al. (2012) Low defect density bulk AlN substrates for high performance electronics and optoelectronics, Materials Science Forum 717-720, 1287-90, both of which are incorporated by reference herein.

Figure 3:
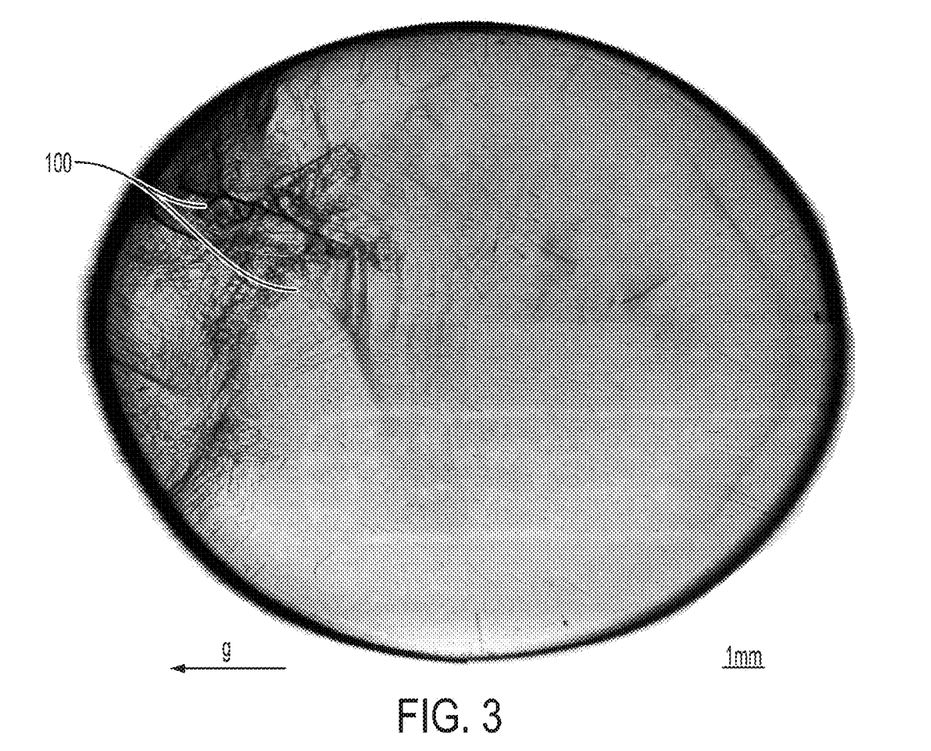
FIG. 3 illustrates an X-ray topography image of an AlN substrate with a dislocation density of $10^2$ to $10^3$ cm$^{-2}$ according to one embodiment of the present invention.

One method used to characterize the lattice distortion in single-crystal wafer substrates is to directly image the dislocation in the crystal by X-ray topography by using synchrotron radiation sources. See e.g., X-Ray Topography-NIST Recommended Practice Guide, National Institute of Standards and Technology, the entire disclosure of which is hereby incorporated by reference. Dislocation density can be observed by plan-view-imaging. The dislocation density is calculated by dividing the total number of dislocations by the area of the view field. As illustrated in FIG. 3, for example, the majority region of an exemplary embodiment of a single crystal AlN substrate wafer has a dislocation density on the order of about 100 $cm^{-2}$ or less. Only the region near type B low angle grain boundary (LAGB) 100 has a dislocation density of $10^3$ $cm^{-2}$.

The dislocation density of the single crystalline AlN substrates described herein is preferably less than about $10^5$ $cm^{-2}$, more preferably less than about $10^4$ $cm^{-2}$, and most preferably less than about $10^3$ $cm^{-2}$. In certain embodiments, the dislocation density of the AlN substrate is less than or equal to about $10^2$ $cm^{-2}$.

For a sample with a relatively low dislocation density, it can be necessary to etch a mechanically polished crystal surface using, for example, a 1:1 ratio by weight mixed solution of potassium hydroxide and sodium hydroxide, at 300° C. for 5 to 10 min. After etching, the etched surface is observed and the number of etch pits is counted by electron microscopy or optical microscopy. The dislocation density is then estimated by dividing the number of observed etched pits by the area of the view field.

Imperfect surface preparation of the substrate can also increase the dislocation density of the resulting optoelectronic device. Accordingly, surface preparation techniques can be utilized to decrease the dislocation density. In an embodiment of the present invention, the AlN substrate surface is prepared by grinding, followed by chemo-mechanical polishing to reduce residual surface roughness. AlN substrate treatment processes can also include reactive ion etching or wet etching using an alkaline solution. Details of the polishing process are not particularly limiting to the present invention. Planarization processing by dry etching can also be used. A very smooth and flat substrate surface, consisting of atomic steps, is desirable regardless of the surface preparation method used.

Figure 1:
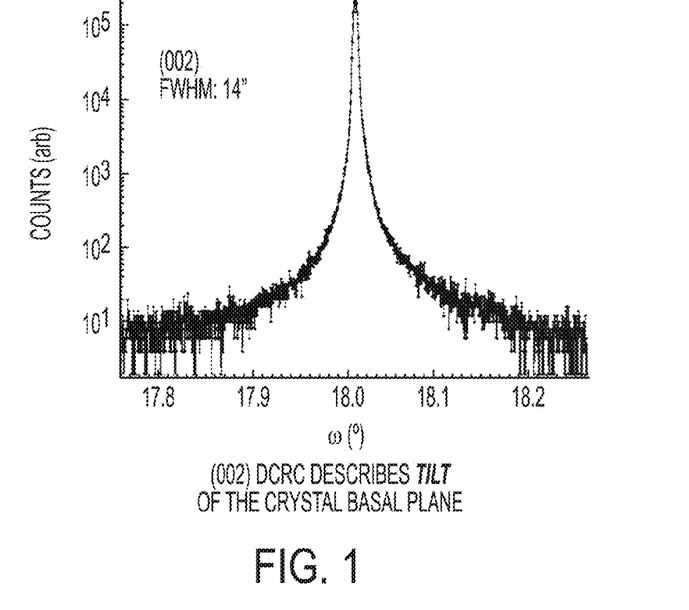
FIGS. 1 and 2 illustrate double axis rocking curves of an AlN substrate used in one embodiment of the present invention.
Figure 2:
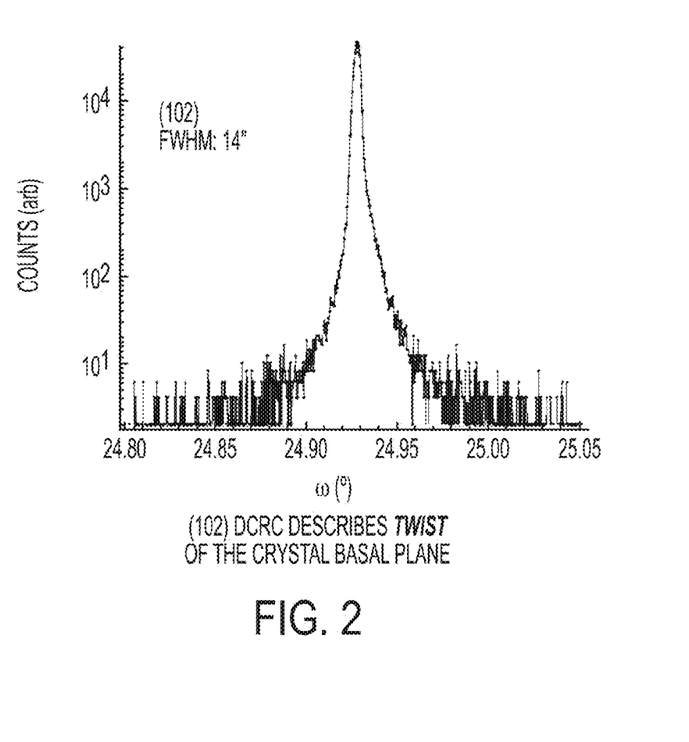

High resolution X-ray diffraction (HRXRD) is another standard method used to characterize the lattice distortion in single crystal substrates. See e.g., NIST High Resolution X-Ray Diffraction Standard Reference Material: SRM 2000 link: http://www.nist.gov/manuscript-publication-search.cfm?pub_id=902585, the entire disclosure of which is hereby incorporated by reference. See also, High Resolution X-Ray Diffractometry And Topography by D. K. Bowen, B. K. Tanner, CRC Press 1998, the entire disclosure of which is hereby incorporated by reference. The dislocation density can be characterized by Full Width Half Maximum (FWHM) of the rocking curve (RC) in HRXRD measurement. A narrow peak suggests less lattice disorder in the crystal, which means low dislocation density. Specifically, the FWHM of X-ray RCs for the crystallographic plane of AlN substrates used in the present invention is preferably less than about 200 arcsec, less than about 100 arcsec, less than about 50 arcsec, or less than about 25 arcsec. Exemplary ranges include about 1 to about 200 arcsec, about 5 to about 50 arcsec, and about 10 to about 25 arcsec. In an example test environment, all XRD measurements were performed with a Philips X'Pert MRD diffractometer using Cu K$\alpha_1$ radiation of $\lambda=1.540\,56$ Å. The x-ray tube was in point focus set to 40 kV 45 mA. The double-axis configuration utilized a Ge (2 2 0) four-bounce monochromator and an open detector. The spot size of the X-ray beam is approximately 10 mm. As shown in FIGS. 1 and 2, for example, AlN substrates used in one embodiment of the present invention showed (002) and (102) double axis RC with a FWHM of about 14 arcsec.

Light-Emitting Device Structures

Semiconductor devices such as light-emitting devices comprise a multilayer structure formed on a base substrate. In order to increase light emission efficiency, each layer requires high crystallinity with few dislocations and point defects. Generally, an LED comprises a multilayer structure including a substrate base as well as an active region between an n-type semiconductor layer electrically connected to an n-electrode and a p-type semiconductor layer electrically connected to a p-electrode. Achieving low defect densities throughout the active region is critical for the efficiency and lifetime of a nitride-based semiconductor device. As discussed above, a high-quality substrate described herein is used to construct optoelectronic devices with low defect densities as well as desirable performance characteristics.

The precise structure and method of preparation for the light-emitting devices of the invention can vary, but will typically involve epitaxial growth, mounting, and packaging processes known in the art. One of the advantages of using the high quality AlN substrates noted above to construct the light-emitting devices of the invention is the fact that less optimization of the light-emitting structure is required to obtain strong device performance.

Figure 4:
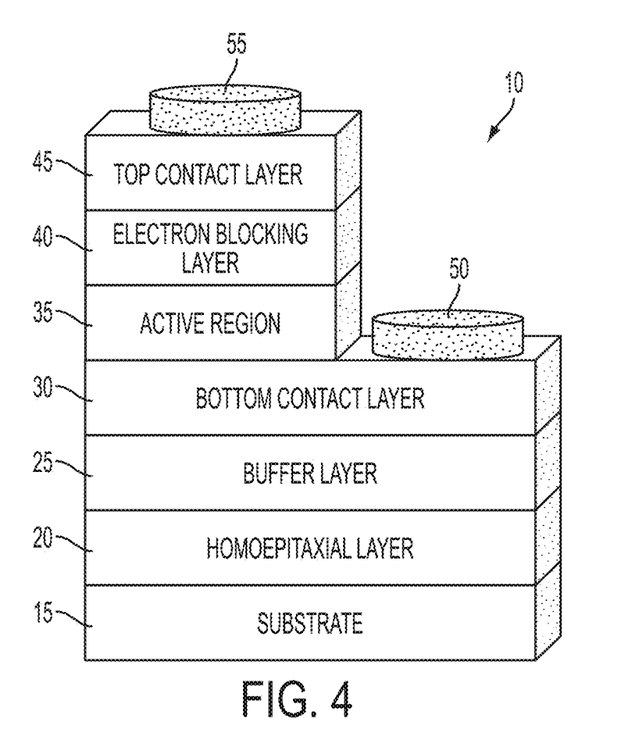
FIG. 4 is a schematic illustration of an embodiment of an optoelectronic device adapted to emit ultraviolet light according to the present invention.

Although the LED and LD devices of the invention can be simple homojunction or double heterostructure devices, multi-well active layer devices are preferred. One exemplary LED device structure is illustrated in FIG. 4. The illustrated device includes an AlN substrate 15 as described above, with a typical thickness of about 400 to about 600 microns, with an overlying optional homoepitaxial AlN layer 20. The presence of the homoepitaxial layer 20, which is typically about 100 to about 300 nm in thickness, can improve the light emission efficiency of the multilayer structures subsequently fabricated on the homoepitaxial layer.

In one embodiment, an optional graded buffer layer 25 having an exemplary thickness of about 0.5 to about 5 microns is formed on the homoepitaxial layer 20. The buffer layer 25 may include or consist essentially of one or more n-type nitride semiconductor materials, e.g., $Al_xGa_{1-x}N$. In an embodiment, the buffer layer 25 has a composition approximately equal to that of the substrate. The buffer layer can improve the electrical and conductive characteristics of the bottom contact layer 30 discussed below. In another embodiment, the composition of the buffer layer 25 can be chosen to consist essentially of the same materials used for the active region 35 of the device. In particular, the buffer layer 25 can exhibit a $Al_xGa_{1-x}N$ composition, wherein the Al concentration x ranges from about 60% to about 100% by weight.

A bottom contact layer 30 is also formed above the substrate 15. The bottom contact layer 30 may include or consist essentially of $Al_xGa_{1-x}N$ doped with at least one impurity, such as Si, and has a typical thickness of about 0.5 to about 2 microns. In an embodiment, the Al concentration in the bottom contact layer 30 is approximately equal to the Al concentration in the desired active region 35 of the device 10 described below. In a preferred embodiment, the bottom contact layer 30 is an n-type pseudomorphic layer, such as n-$Al_{0.75}Ga_{0.25}N$.

In the illustrated embodiment, a multiple quantum well ("MQW"), corresponding to active region 35, is formed above the bottom contact layer 30. A quantum well is a potential well with only discrete energy values. Quantum wells are formed in semiconductors by having a one material sandwiched between two layers of a material with a wider band gap. Each of the at least one layers in the active region 35 can include or consist essentially of AlGaN. In a preferred embodiment, the quantum well structure 35 is a stack structure that combines multiple well layers with thicknesses from about 5 nm to about 50 nm, and barrier layers with larger band gap energy than the well layers. The band gap energy and thickness of the well layers and the barrier layers can be tailored to obtain desired optical emission properties. In a preferred embodiment, the emission wavelength of the optoelectronic devices is in the range from 100 nm to 400 nm (e.g., about 150 to about 300 nm or about 250 to about 290 nm), which depends on the AlGaN composition (i.e., the band gap energy of the materials forming the active region) and thickness of quantum well layers.

In one embodiment, an optional electron blocking layer 40 (or hole-blocking if the n-type contact is put on top of the device as the top contact layer) can be formed above the active region 35. The optional blocking layer 40 can include or consist essentially of $Al_xGa_{1-x}N$ and can be doped with one or more impurities such as Mg. A blocking layer 40 can, for example, have a thickness between about 2 nm and about 50 nm.

A top contact layer 45 is formed above the active region 35. The top contact layer is doped either n-type or p-type with a conductivity opposite that of the bottom contact layer 30. In one embodiment, the top contact layer 45 is p-GaN with a typical thickness of about 50 nm to about 200 nm.

Laser diode ("LD") structures are similar to LED structures. LDs incorporate additional layers which properly confine photons to create a resonant cavity. In an edge-emitter LD, the resonant cavity is directed perpendicular to the layer growth direction and the semiconductor layer structure is cleaved or etched to create mirrors. In such an embodiment, the layers above and below the active region are modified to act as cladding layers to ensure that the emitted photons propagate perpendicular to layer growth direction without significant absorption.

After fabricating the device layers, additional processes, such as etching to expose a given conductive layer and electrode formation steps to contact the conductive layer surface, are necessary to produce a functional light-emitting device. The bottom contact layer 30 is electrically connected to a first electrode 50. The top contact layer 45 is electrically connected to a second electrode 55. In a preferred embodiment, the bottom contact layer 30 is an n-type semiconductor material electrically connected to a cathode 50 and the top contact layer 45 is a p-type semiconductor material electrically connected to an anode 55. The electrode materials are typically constructed of known ohmic metal materials, such as Ti/Al/Ti/Au (20/100/100/100 nm) rapidly annealed at 900° C. in nitrogen ambient for n-type AlGaN and Ni/Au (20/100 nm) for p-type GaN annealed at 600° C. in air, for example.

Method of Fabricating Light-Emitting Devices

The light-emitting structures discussed herein can be formed by epitaxial growth processes known in the art, such as molecular-beam epitaxy (MBE), metal organic chemical vapor deposition (MOCVD), Hydride Vapor Phase Epitaxy (HVPE), liquid phase epitaxy (LPE), or the like. MOCVD processes are preferable in order to control the thickness of the device layers as well as the incorporation of dopants. Exemplary precursors for forming an n-type contact layer or a MQW structure include trimethylaluminum, trimethylgallium, ammonia, silane or tetraethylsilane and hydrogen gas as well as nitrogen as a carrier gas. Exemplary precursors for a p-type contact layer include trimethylaluminum, trimethylgallium, ammonia, bis-cyclopentadienyl magnesium and hydrogen gas, as well as nitrogen as a carrier gas. If desired, to improve ultraviolet transparency of the final LED structure, the AlN substrate can be polished to remove much of its thickness. For example, the final substrate thickness can be less than about 100 microns, more typically less than about 75 microns, or even less than about 50 microns.

Many single crystalline substrates are C-plane substrates. Regardless of the epitaxy method used, the deposited layers become a continuation of the substrate's crystal structure. Therefore, in order to achieve a low dislocation density throughout all layers of an optoelectronic device, a substrate with a low dislocation density is necessary as described above. Methods for constructing light-emitting devices are set forth, for example, in U.S. Pat. No. 8,080,833 to Grandusky et al. and U.S. Pat. No. 8,222,650 to Showalter et al.; as well as in Dalmau et al. (2011) Growth and characterization of AlN and AlGaN epitaxial films on AlN single crystal substrates, Journal of the Electrochemical Society, 158(5), H530-H535; Collazo et al. (2011) 265 nm light emitting diodes on AlN single crystal substrates: Growth and characterization, (2011 Conference on Lasers and Electro-Optics (CLEO)); Collazo et al. (2011) Progress on n-type doping of AlGaN alloys on AlN single crystal substrates for UV optoelectronic applications, Physica Status Solidi C-Current Topics in Solid State Physics, 8, 7-8; and Grandusky et al. (2010) Performance and reliability of ultraviolet-C pseudomorphic light emitting diodes on bulk AlN substrates, Phys. Status Solidi C, 7: 2199-2201, all of which are incorporated by reference herein.

Light-Emitting Device Performance

Transmission electron microscopy ("TEM") is another standard method used to characterize the lattice distortion in substrate and device layers. The dislocation in the crystal can be directly imaged by using electron beams transmitted through ultra thin substrate specimens. An image is formed from the interaction of the electrons transmitted through the specimen.

In various embodiments of the present invention, cross-sectional TEM analysis of the device layers revealed that no additional dislocations are formed at the substrate-device layer interface, and, therefore, it can be concluded that the dislocation density in the device layers is essentially identical to that of the substrate. This is due to the fact that device layers are grown pseudomorphically (i.e. the lattice mismatch between AlN substrate and AlGaN layers is not relaxed) in preferred embodiments.

Figure 6:
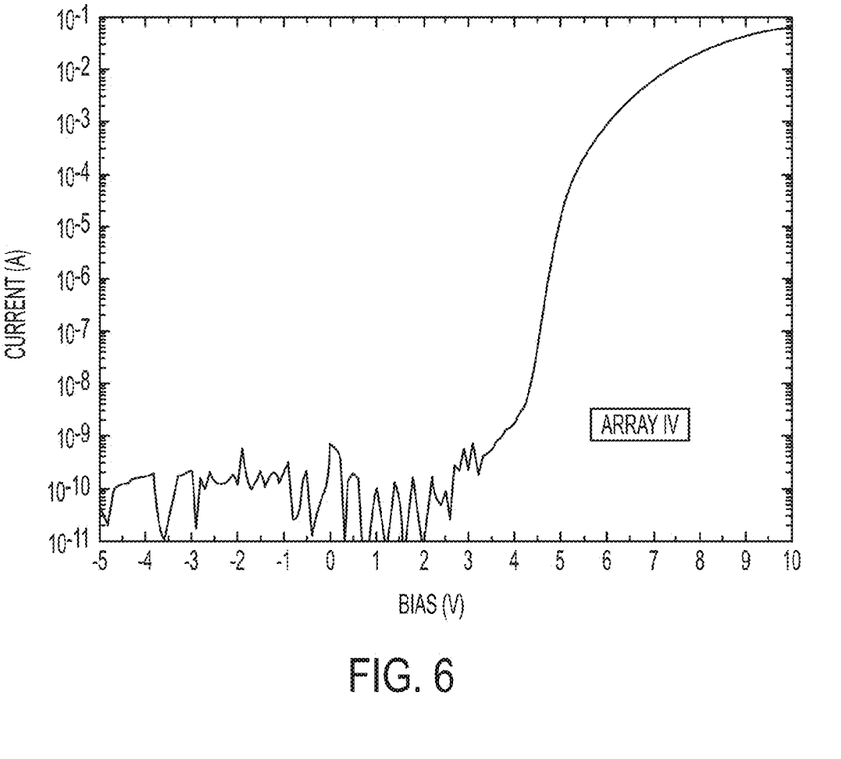
FIG. 6 illustrates a current-voltage curve (I-V curve) exemplifying the I-V characteristics of an embodiment of a UV LED overlaying an AlN substrate, the UV LED having an ultra low reverse leakage current.

In addition to dislocation density, reverse leakage current is an important parameter to characterize the quality of a light emitting device. Current-voltage measurement is a standard method used to determine reverse leakage current in a device. Low reverse leakage current indicates absence of leakage path and high crystal quality. See Semiconductor Material and Device Characterization, 3rd edition, Dieter K. Schroder, 2005, IEEE Computer Society Press, the entire disclosure of which is hereby incorporated by reference. In a typical epitaxial structure grown on a foreign substrate, the dislocations run vertically from the substrate towards the surface that is perpendicular to the junction plane. Therefore, dislocations are the source of current leakage at both reverse and forward bias, which will degrade the light-emitting device over time. Under the forward bias, the dislocations could be electrically activated and act as a diffusion channel at high field, due to the high density of point defects such as vacancies. For example, a Keithley 4200 semiconductor parameter analyzer can be used for current-voltage measurements. The voltage range covers from −20 V to 20 V. The resolution of current measurement is 10 pA. A current-voltage curve for a UV-emitting LED of the invention with ultra low reverse leakage current is illustrated in FIG. 6, for example. In certain embodiments, the reverse leakage current of light-emitting devices of the invention is less than about $10^4$ A/cm$^2$, more typically less than about $10^{-5}$ A/cm$^2$, and most often less than about $10^{-6}$ A/cm$^2$ at −10V, which is as much as 1000 to 10,000 times less than currently available commercial UV-emitting LED products.

Lifetime of a light-emitting device is another important parameter used to characterize the quality of the device. However, full life measurement of LEDs is very time consuming. For example, with 24/7 operation, testing an LED for 10,000 hours would take more than one year. Typically, lifetime measurement of an LED requires the proper package since heat is one of the major factors influencing an LED's lifetime. Lifetime normally decreases as junction temperature increases. Since the lifetime of an LED is normally long, accelerated lifetime testing is adopted by increasing the ambient temperature. See Accelerated Life Test of High Brightness Light Emitting Diodes, IEEE Transactions on device and material reliability, vol. 8 p. 304, (2008), the entire disclosure of which is hereby incorporated by reference. Lifetime data is typically recorded after a 48-hour burn-in at a current level higher than the operational level where the output power drops sharply.

One method of expressing LED lifetime is in the form of "L80" measurements, meaning the length of time it takes for the output power (after burn-in) to drop to 80% of peak value at a given injection current. Experimental reports of UV-emitting LEDs having an AlN substrate have relatively low lifetimes. According to published reports, at an injection current of 100 mA, L80 is only about 600 hours, and only about 300 hours when the device is operated at a higher current of 150 mA. In contrast, LEDs fabricated on the high quality substrates described herein surprisingly displayed an L80 of greater than about 800 hours, more typically greater than about 900 hours, and most often greater than about 1000 hours, even at elevated junction temperatures of 170° C. and high input electrical power levels (e.g., 144 A/cm$^2$) that would typically destroy traditional UV LEDs. At low injection current density of 28 A/cm$^2$, the L80 is at least about 2000 hours, or at least about 3000 hours, at least about 4000 hours, or at least about 5000 hours, or even at least about 6000 hours or at least about 7000 hours.

Methods of Using Light-Emitting Devices

III-nitride based ultraviolet light-emitting devices of the invention would be useful in any industry where UV light finds use, such as in disinfection and sterilization, currency authentication, identification verification, photolithography, phototherapy, or for detection of body fluids or other organic matter. For example, U.S. Patent Publication No. 2009/0250626A1, the entire disclosure of which is hereby incorporated by reference, discloses a liquid sanitization device including one or more LEDs that emit electro-magnetic radiation primarily at two or more distinct UV wavelengths. U.S. Patent Publication No. 2010/0314551A1, the entire disclosure of which is hereby incorporated by reference, discloses a method and system of purifying a flowing liquid to produce a desired germicidal effect by exposing the liquid to UV radiation with at least one UV LED.

EXPERIMENTAL

Figure 5:
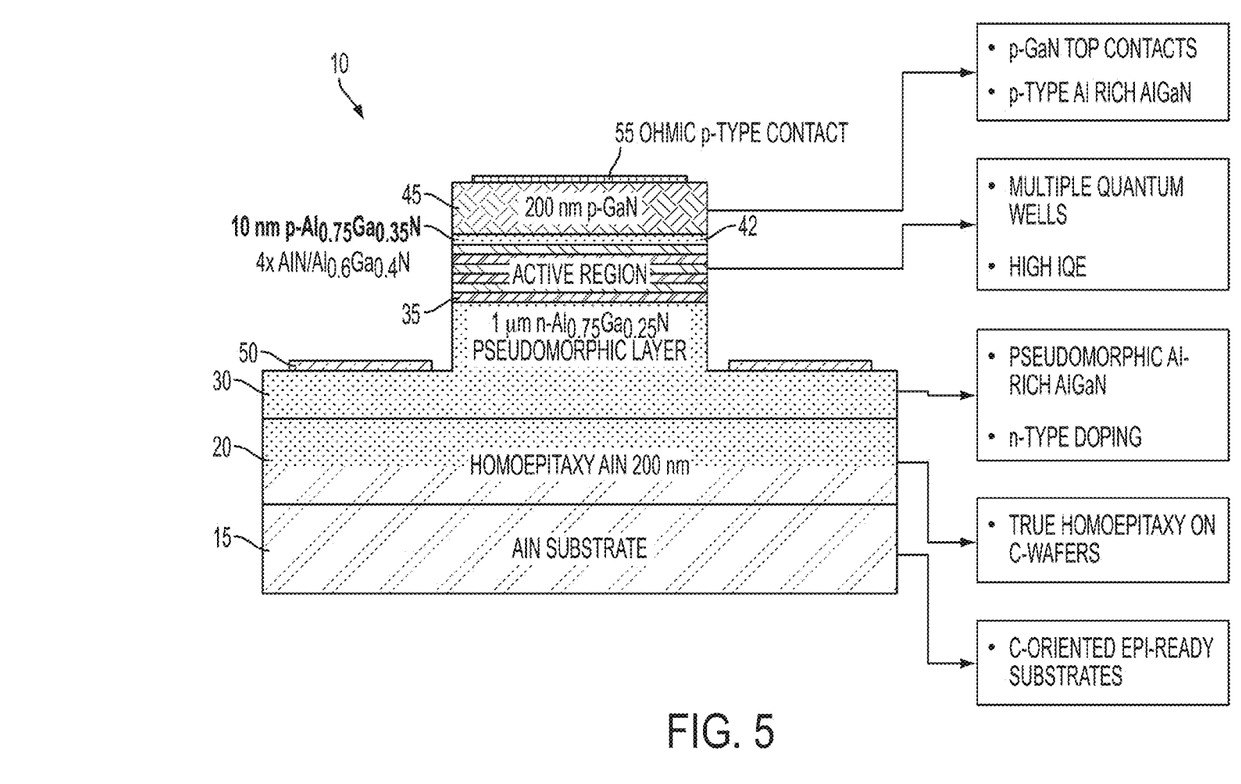
FIG. 5 is a schematic illustration of an embodiment of a light emitting diode device adapted to emit ultraviolet light and constructed as described in Example 1.

A UV-emitting device is formed as illustrated in FIG. 5 utilizing an AlN single crystal substrate 15 available from HexaTech, Inc. The AlN substrate has high-quality characteristics including a low defect density. In particular, the AlN substrate has an average extended defect density of the substrate less than about $10^4$ cm$^{-2}$, and XRD Rocking curves routinely below 50 arcsec, and frequently below 20 arcsec.

The substrate is first prepared by chemo-mechanical polishing that provides an epitaxial ready surface. The AlN substrate 15 is loaded into a MOCVD reactor and heated above 1200° C., and more preferably above 1350° C. The surface of the highly transparent AlN single crystalline substrate 15 is cleaned through annealing in a hydrogen atmosphere. After cleaning the surface, multiple epitaxial layers are deposited by MOCVD. The fabricated LED comprises layered films of homoepitaxial AlN layer (about 200 nm thick) 20, a layer of n-$Al_{0.75}Ga_{0.25}N$ for the n-type electrical contact layer 30, an AlGaN/AlGaN multi-quantum well active region 35 (including four i-$Al_{0.6}Ga_{0.4}N$ layers), a p-$Al_{0.90}Ga_{0.10}N$ electron blocking layer (not shown), a p-type AlGaN cladding layer 42 (about 10 nm thick), and a p-type GaN electrical contact layer 45 (about 200 nm thick). In this example, the MQW structure is tailored to operate at an emission wavelength of approximately 240 nm.

When the group III-nitride semiconductor device layers described above are formed, the precursor supply ratio, the growth temperature, and the ratio of nitrogen to III-metals (V/III ratio) can be tailored to achieve desired optical and electrical properties. The fully operational device is fabricated through standard photolithography and lift off process, resulting in a mesa structure with two metal contacts, namely an anode 55 and a cathode 50. With such a method, the LED device formed has extended dislocation density less than about $10^4$ cm$^{-2}$ on average, which can be confirmed by transmission electron microscopy and other methods.

Additionally, the LED device structure formed via the method described above has a reverse leakage current lower than $10^{-6}$ A/cm$^2$ at −10V, which is 1000 to 10,000 times less than currently available commercial products. Characteristics of the current-voltage curve of this UV LED fabricated on the AlN substrate with ultra low reverse leakage current are illustrated in FIG. 6. The ultra low reverse leakage current measured for the UV LED indicates absence of leakage path and therefore high crystal quality of the AlN substrate used to fabricate this device.

Figure 8:
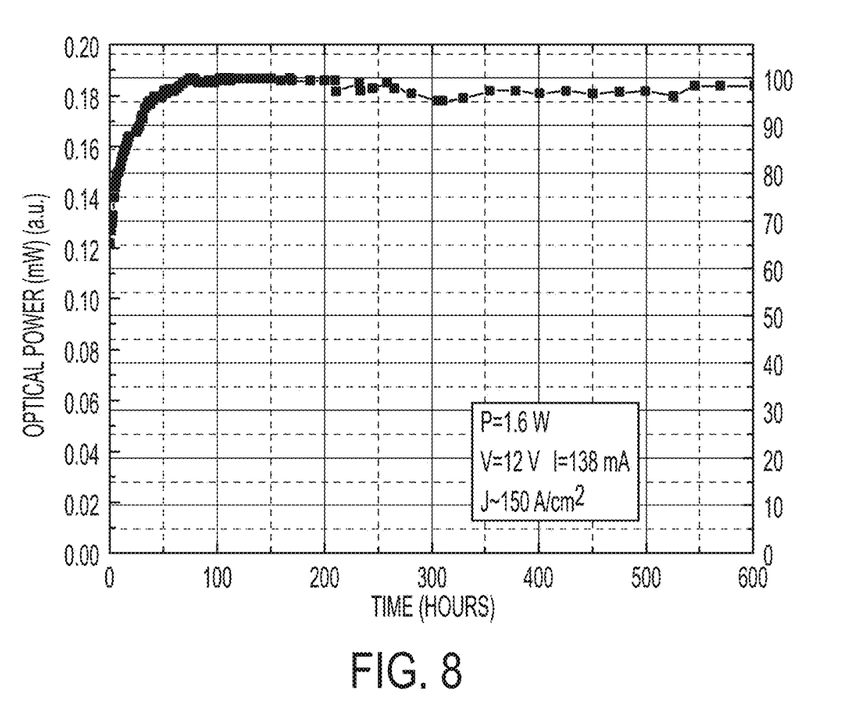
FIG. 8 illustrates a plot of accelerated on-wafer optical power output over time as measured for an embodiment of an LED device emitting a wavelength of 270 nm and fabricated on an AlN substrate.

During an accelerated lifetime measurement of the fabricated device described above, the junction temperature is calculated at approximately 180° C. with a current density of approximately 150 A/cm$^2$. At constant injection current, the light output power first increases and stabilizes at the peak value, without any noticeable degradation over more than 600 hours, as illustrated in FIG. 8. Considering the very high junction of 180° C., the lifetime of such a device (L80) is greater than 2000 hours.

Figure 9:
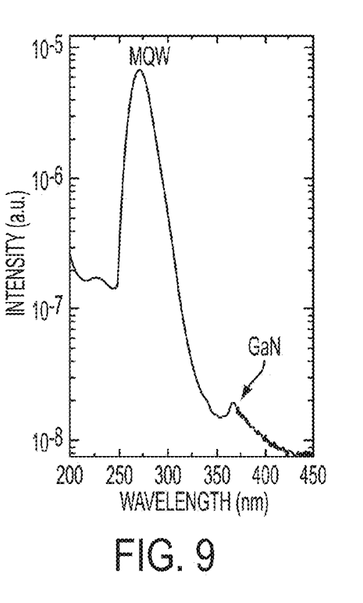
FIG. 9 illustrates a plot of the emitting spectrum of an embodiment of an LED adapted to emit ultraviolet light.
Figure 10:
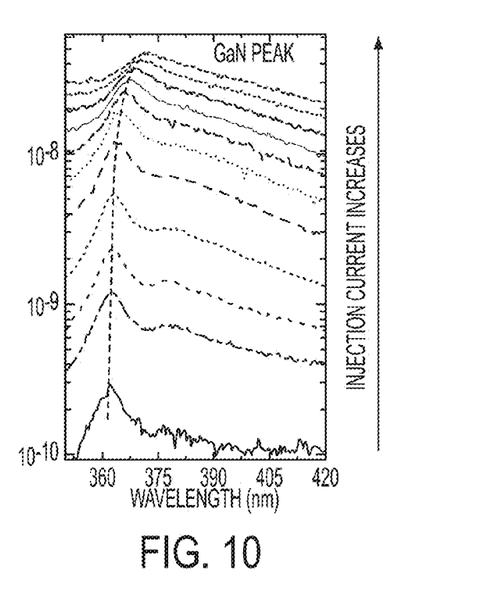
FIG. 10 illustrates a plot of a GaN peak at increasing injection currents of an embodiment of an LED adapted to emit ultraviolet light.
Figure 11:
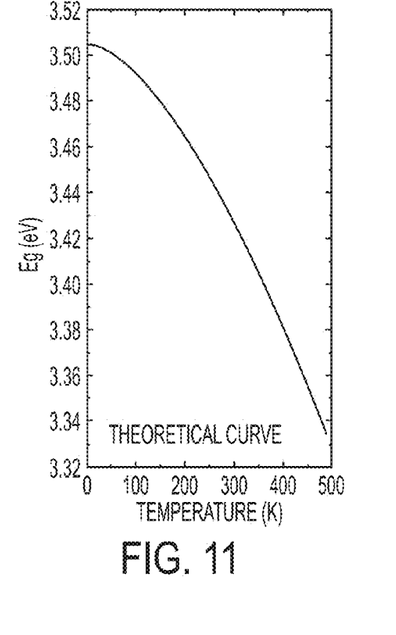
FIG. 11 illustrates a theoretical curve of GaN bandgap as a function of temperature of an embodiment of an LED adapted to emit ultraviolet light.
Figure 12:
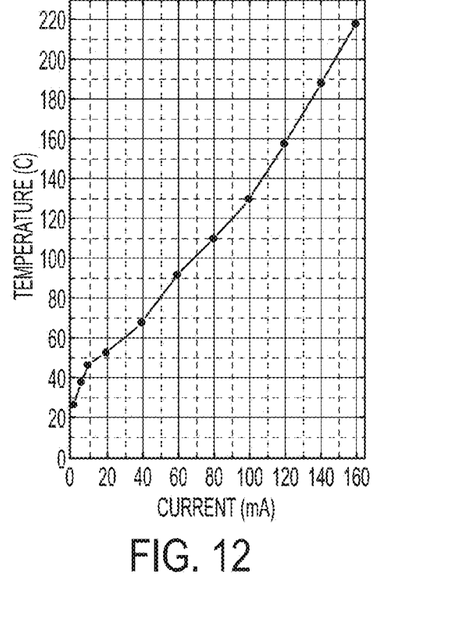
FIG. 12 illustrates a plot of experimental data showing junction temperature as a function of injection current for an LED device adapted to emit ultraviolet light.

During the accelerated lifetime test, the most important parameter is the junction temperature which is used to calculate the device's lifetime. In an embodiment, an internal "thermometer" is used to monitor the junction temperature during the lifetime measurement. In the device structure, an electron leakage is intentionally created by reducing the thickness of the electron blocking layer. The "intentional leakage" here refers to electrons "leaking" out of the quantum well (the active region). In an ideal case, electrons and holes only meet and recombine in the quantum well such that a single wavelength of light is emitted (i.e., a single peak in the spectrum is measured). However, because the effective mass of electrons is much lighter than holes, an electron blocking layer is required to properly confine the electrons in the quantum well. By reducing the thickness of the electron blocking layer, some of the electrons can reach the p-GaN contact layer. This then allows the electrons leaking into the p-GaN contact layer to recombine with holes there and emit a wavelength corresponding to the bandgap of the GaN. The peak position of GaN, which is the bandgap of the GaN, is only dependent on the temperature. As illustrated in FIGS. 9 and 10, when the injection current is increasing, the junction temperature also increases which results in the shrinking of the bandgap of GaN. As a consequence, the emission peak due to the GaN will have a red shift (towards longer wavelength/smaller energy). Therefore, the junction temperature can be determined based on GaN peak position. A theoretical curve of GaN bandgap as a function of temperature is illustrated in FIG. 11, for example. Experimental results of junction temperature as a function of injection current are illustrated in FIG. 12, for example. From FIG. 12, a user can estimate the junction temperature is about 180° C. for an injection current of 138 mA, for example.

Figure 7:
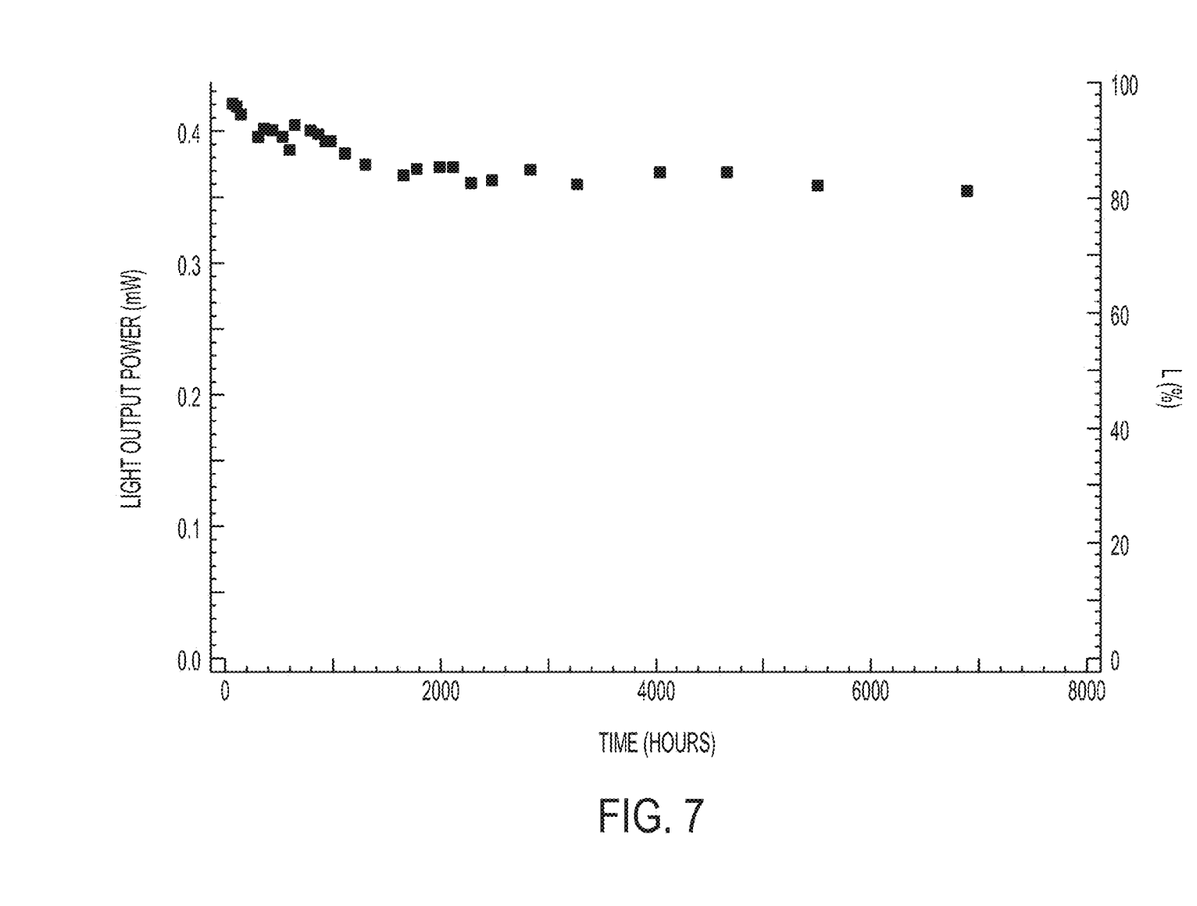
FIG. 7 illustrates a plot of optical power output over time in a real lifetime test as measured for an embodiment of an LED device packaged in a TO-39 can, emitting a wavelength of 270 nm, and fabricated on an AlN substrate.

In addition to the on-wafer testing described above, individual LEDs were placed onto a standard TO-39 can for a more conventional, non-accelerated life test. The lifetime of these packaged LEDs is plotted in FIG. 7, for example. During the non-accelerated lifetime measurement of the fabricated device described above, on package measurement was used without active cooling. The junction temperature is unknown, however, the test was conducted at ambient temperature (25° C.) and the lifetime of the device (L80) is greater than 7000 hours at an injection current density of 28 A/cm$^2$.

Many modifications and other aspects of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific aspects disclosed and that modifications and other aspects are intended to be included within the scope of the claims. Although specific terms are employed herein, they are used in a generic and descriptive sense only and not for purposes of limitation.

What is claimed is:

1. An optoelectronic device adapted to emit ultraviolet light, comprising:
   an aluminum nitride single crystalline substrate, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec; and
   an ultraviolet light-emitting diode structure overlying the aluminum nitride single crystalline substrate, the diode structure comprising a first electrode electrically connected to an n-type semiconductor layer and a second electrode electrically connected to a p-type semiconductor layer;

wherein the optoelectronic device has a reverse leakage current less than about $10^{-5}$ A/cm$^2$ at −10V.

2. The optoelectronic device of claim 1, wherein the dislocation density of the substrate is lower than $10^4$ cm$^{-2}$.

3. The optoelectronic device of claim 1, wherein the dislocation density of the substrate is lower than $10^3$ cm$^{-2}$.

4. The optoelectronic device of claim 1, wherein the dislocation density of the substrate is lower than $10^2$ cm$^{-2}$.

5. The optoelectronic device of claim 1, wherein the FWHM of the double axis rocking curve for the (002) and (102) crystallographic planes is less than about 100 arcsec.

6. The optoelectronic device of claim 1, wherein the FWHM of the double axis rocking curve for the (002) and (102) crystallographic planes is less than about 50 arcsec.

7. The optoelectronic device of claim 1, wherein the FWHM of the double axis rocking curve for the (002) and (102) crystallographic planes is less than about 25 arcsec.

8. The optoelectronic device of claim 1, wherein the ultraviolet light-emitting diode structure further comprises a multi-well active region extending between the n-type semiconductor layer and the p-type semiconductor layer.

9. The optoelectronic device of claim 1, wherein the optoelectronic device has a reverse leakage current less than about $10^{-6}$ A/cm$^2$ at −10V.

10. The optoelectronic device of claim 1, wherein the emission wavelength of the optoelectronic device is in the range from about 250 nm to 290 nm.

11. The optoelectronic device of claim 1, wherein the n-type semiconductor layer comprises n-Al0.75Ga0.25N and the p-type semiconductor layer comprises p-GaN.

12. The optoelectronic device of claim 1, wherein the ultraviolet light-emitting diode structure is deposited onto the substrate by metal organic chemical vapor deposition.

13. The optoelectronic device of claim 1, wherein the aluminum nitride single crystalline substrate is prepared by physical vapor transport.

14. An optoelectronic device adapted to emit ultraviolet light, comprising:

an aluminum nitride single crystalline substrate prepared by physical vapor transport, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec; and an ultraviolet light-emitting diode structure overlying the aluminum nitride single crystalline substrate and adapted to emit light at a wavelength of about 150 to about 300 nm, the diode structure comprising a first electrode electrically connected to an n-type semiconductor layer and a second electrode electrically connected to a p-type semiconductor layer;

wherein the optoelectronic device is characterized by an L80 of 2000 hours or greater at an injection current density of 150 A/cm$^2$.

15. The optoelectronic device of claim 14, wherein the optoelectronic device is characterized by a reverse leakage current less than about $10^{-6}$ A/cm$^2$ at −10V.

16. The optoelectronic device of claim 14, wherein the emission wavelength of the optoelectronic device is in the range from about 250 nm to 290 nm.

17. The optoelectronic device of claim 14, wherein the FWHM of the double axis rocking curve for the (002) and (102) crystallographic planes is less than about 25 arcsec.

18. The optoelectronic device of claim 14, wherein the dislocation density of the substrate is lower than $10^2$ cm$^{-2}$.

19. The optoelectronic device of claim 14, wherein the optoelectronic device has a reverse leakage current less than about $10^{-5}$ A/cm$^2$ at −10V.

20. The optoelectronic device of claim 14, wherein the n-type semiconductor layer comprises n-Al0.75Ga0.25N and the p-type semiconductor layer comprises p-GaN.

21. The optoelectronic device of claim 14, wherein the ultraviolet light-emitting diode structure further comprises a multi-well active region extending between the n-type semiconductor layer and the p-type semiconductor layer.

\* \* \* \* \*